US 6,635,581 B2

(12) United States Patent
Wong

(10) Patent No.: US 6,635,581 B2
(45) Date of Patent: Oct. 21, 2003

(54) METHOD FOR FORMING A THIN-FILM TRANSISTOR

(75) Inventor: Jia-Fam Wong, Hsinchu (TW)

(73) Assignee: AU Optronics, Corp., Hsinchu (TW)

( * ) Notice: Subject to any disclaimer, the term of this patent is extended or adjusted under 35 U.S.C. 154(b) by 0 days.

(21) Appl. No.: 10/121,537

(22) Filed: Apr. 11, 2002

(65) Prior Publication Data

US 2002/0187592 A1 Dec. 12, 2002

(30) Foreign Application Priority Data

Jun. 8, 2001 (TW) ........................................ 90113936 A

(51) Int. Cl.[7] ...................... H01L 21/302; H01L 21/461
(52) U.S. Cl. ........................ 438/736; 438/703; 430/312
(58) Field of Search .................................. 438/702, 703, 438/736, 945, 948, 950; 430/311, 312

(56) References Cited

U.S. PATENT DOCUMENTS

| | | | | |
|---|---|---|---|---|
| 5,091,339 A | * | 2/1992 | Carey | 216/18 |
| 5,286,607 A | | 2/1994 | Brown | 430/313 |
| 5,494,839 A | * | 2/1996 | Hong et al. | 438/253 |
| 5,700,626 A | * | 12/1997 | Lee et al. | 430/296 |
| 5,741,624 A | * | 4/1998 | Jeng et al. | 430/312 |
| 6,221,542 B1 | * | 4/2001 | Reinberg | 430/5 |
| 6,350,674 B1 | * | 2/2002 | Okamura | 438/624 |

OTHER PUBLICATIONS

"Technical Report", FPT Intelligence, pp. 31–33 (May, 1995).
*Japanese LCD Technical Literature*, vol. 4, pp.61.

* cited by examiner

*Primary Examiner*—Amir Zarabian
*Assistant Examiner*—Jamie L. Brophy
(74) *Attorney, Agent, or Firm*—Ladas & Parry

(57) ABSTRACT

A method for forming a thin film transistor (TFT) is disclosed. A gate electrode, insulating layer, semiconductor layer, doped silicon layer and metal layer are formed on a substrate. A first photoresist layer with a first absorptivity is formed on the metal layer. A second photoresist layer with a second absorptivity is formed on the first photoresist layer. The second absorptivity is higher than the first absorptivity. An exposure process and a development process are performed to form a first pattern on the first photoresist layer and a second pattern on the second photoresist layer at the same time. An etching process is then performed to transfer the first pattern into the semiconductor layer, the doped silicon layer and the metal layer and transfer the second pattern into the doped silicon layer and the metal layer. After performing the etching process, the first photoresist layer and the second photoresist layer are removed.

16 Claims, 6 Drawing Sheets

METHOD FOR FORMING A THIN-FILM TRANSISTOR

BACKGROUND OF THE INVENTION

1. Field of the Invention

The present invention relates in general to a method for forming a thin-film transistor (TFT). In particular, the present invention relates to a method for forming a pattern with different depths by an etching process.

2. Description of the Related Art

The TFT is an active element commonly used in a liquid crystal display (LCD). During the addressing period for inputting the image data, the semiconductor layer of the TFT has a low resist value (the "on" state), and the image data is written into a capacitor and the orientation of the liquid crystal molecules are changed. In the sustaining period, the semiconductor layer of the TFT has a high resist value (the "off" state), and the image data is maintained.

The conventional TFT used in the flat display panel is shown in FIG. 1, and its manufacturing process is described below. The substrate 10 has a TFT region, and a first metal layer is formed in the TFT region. The first metal layer is patterned to form a gate line 12 along a first direction by a first lithography and etching process. An insulating layer 14, a semiconductor layer 16, an n-doped silicon layer 18 and a second metal layer 20 are sequentially deposited on the gate line 12. The semiconductor layer 16 can be an amorphous silicon layer. A second lithography and etching process is used to pattern the amorphous silicon layer 16, the n-doped silicon layer 18 and the second metal layer 20 to expose the insulating layer 14. The second metal layer 20 is also patterned to form a signal line along a second direction, and the second direction is vertical to the first direction. The third lithography and etching processes are conducted to define a channel 19 in the second metal layer 20 and the n-doped silicon layer 18 so as to expose the amorphous silicon layer 16 in the channel 19. A source electrode and a drain electrode are formed and separated by the channel 19.

The conventional manufacturing method needs several lithography and etching processes to form the TFT, and is a time-consuming and costly procedure. An alternate method is proposed to pattern the second metal layer and form the channel in one lithography and etching process by using a photoresist layer having different depths. In other words, the second and third lithography and etching processes are combined into one lithography and etching process, thus the manufacturing time and cost can be reduced. The patterned photoresist layer with different depths can be formed by several exposure methods. For example, "slit mask" exposure method is used to pattern the photoresist layer to form different depths, as disclosed in "FPT Intelligence", May 1995, p.31. In addition, a "Halftone mask" exposure method is also used to pattern the photoresist layer to form different depths, as disclosed in Japanese LCD technical literature, volume 4, p.61. Further, a double exposure method can be used to pattern the photoresist layer.

While using the above-mentioned methods to form the photoresist layer with different depths, the material of the photoresist layer will be an important factor. It is a serious problem to choose one photoresist layer appropriate for the "slit mask", "halftone mask", or double exposure method. In other words, forming one photoresist layer with different depths by one exposure method is difficult. By only one exposure process, the accuracy of the patterns on the photoresist layer is poor, and the condition of the exposure process is also hard to maintain. Therefore, the yield of the TFT manufacturing process will be reduced.

SUMMARY OF THE INVENTION

The object of the present invention is to provide a method of forming a thin film transistor (TFT) in which the signal line and the channel can be formed in one process so as to reduce the cost and time.

Another object of the present invention is to provide a method of forming a TFT using multiple photoresist layers with different absorptivities to form the signal line and the channel in one process.

Still another object of the present invention is to provide a method of forming a TFT using multiple photoresist layers with different photosensitivities to form the signal line and the channel in one process.

To achieve the above-mentioned object, a method for forming a thin film transistor (TFT) is provided. In this method, a gate electrode, an insulating layer, a semiconductor layer, a doped silicon layer and a metal layer are formed on a substrate. A first photoresist layer is formed on the metal layer. A second photoresist layer is formed on the first photoresist layer. An exposure process and a development process are performed to form a first pattern on the first photoresist layer and a second pattern on the second photoresist layer at the same time. An etching process is performed to transfer the first pattern on the semiconductor layer, the doped silicon layer and the metal layer, and also transfer the second pattern on the doped silicon layer and the metal layer. The first photoresist layer and the second photoresist layer are removed.

The absorptivity or photosensitivity of the first photoresist layer is lower than that of the second photoresist layer. Moreover, an adhesion layer can be alternatively formed between the first photoresist layer and the second photoresist layer. The method of patterning the first photoresist layer and the second photoresist layer is selected from a group of multiple exposure, halftone mask exposure, and slip mask exposure.

The step of performing the etching process is performed as follows. The semiconductor layer, the doped silicon layer and the metal layer are etched by using the first photoresist layer and the second photoresist layer as a mask, so as to transfer the first pattern on the above layers. The second pattern is transferred on the first photoresist layer by using the second photoresist layer as a mask. The doped silicon layer and the metal layer are then etched by using the first photoresist layer with the second pattern as a mask, so as to transfer the second pattern on the doped silicon layer and the metal layer.

Further, a method for forming an element is provided. A first photoresist layer is formed on a layer to be etched. A second photoresist layer is formed on the first photoresist layer. An exposure process and a development process are performed to form a first pattern in the first photoresist layer and a second pattern in the second photoresist layer at the same time. After etching process is performed to transfer the first pattern and the second pattern into the layer, the first photoresist layer and the second photoresist layer are removed.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENT

Using different photoresist materials in this invention patterns multiple photoresist layers with different depths. Each of the multiple photoresist layers has a different absorptivity or photosensitivity, and their absorptivity or photosensitivity is decreased gradually from the top layer to the bottom layer. After a developing process, the multiple photoresist layers reveal several patterns with different depths.

Figure 3:
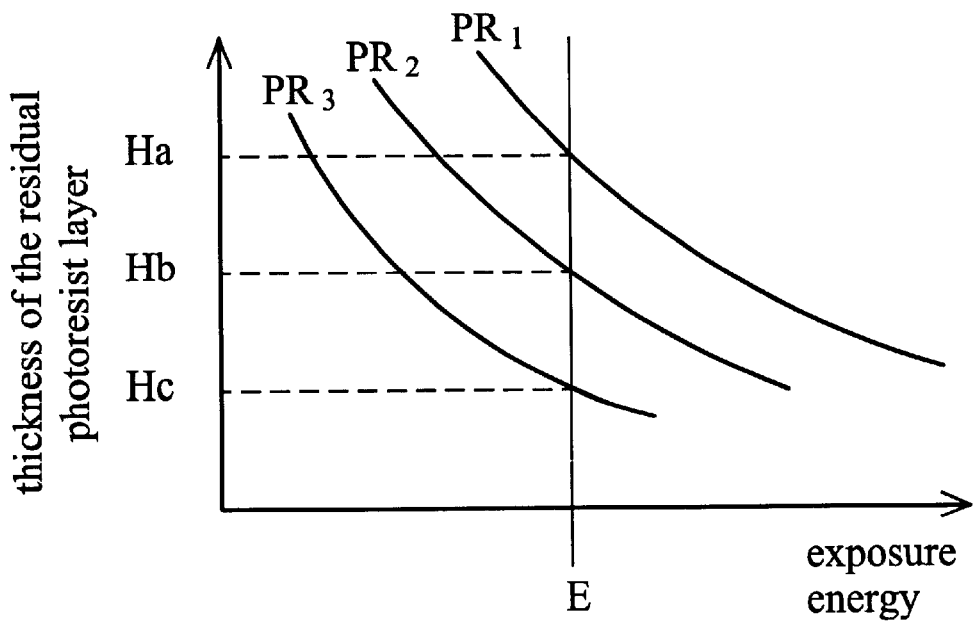
FIG. 3 shows the relationship of the thickness of the residual photoresist layer with different absorptivity and exposure energy after exposure and development.

As shown in FIG. 3, after exposing and developing process, the thickness of the residual photoresist layers decrease with the increase of exposure energy. $PR_1$, $PR_2$ and $PR_3$ indicate three kinds of materials with different absorptivities. Their absorptivities from $PR_1$ to $PR_3$ increase gradually. Assume that the exposure energy is E, then the thickness of the residual photoresist layer $PR_1$ is Ha, the thickness of the residual photoresist layer $PR_2$ is Hb, and the thickness of the residual photoresist layer $PR_3$ is Hc. If the multiple photoresist layers are stacked by $PR_1$, $PR_2$ and $PR_3$, from bottom to top, after exposing and developing, the multiple photoresist layers have three kinds of patterns with the thicknesses of Ha, Hb and Hc.

For example, these three kinds of materials are used to form the multiple photoresist layers and deposed on the layer to be etched. First, the pattern in the top layer $PR_3$ of the multiple photoresist layers is transferred to the layer to be etched and the middle layer $PR_2$ of the multiple photoresist layers. Next, the pattern in the middle layer $PR_2$ of the multiple photoresist layers is transferred to the layer to be etched and the bottom layer $PR_1$ of the multiple photoresist layers. Next, the pattern in the bottom layer $PR_1$ of the multiple photoresist layers is transferred to the layer to be etched. Therefore, the layer to be etched has patterns with three kinds of depths.

First Embodiment

Figure 1:
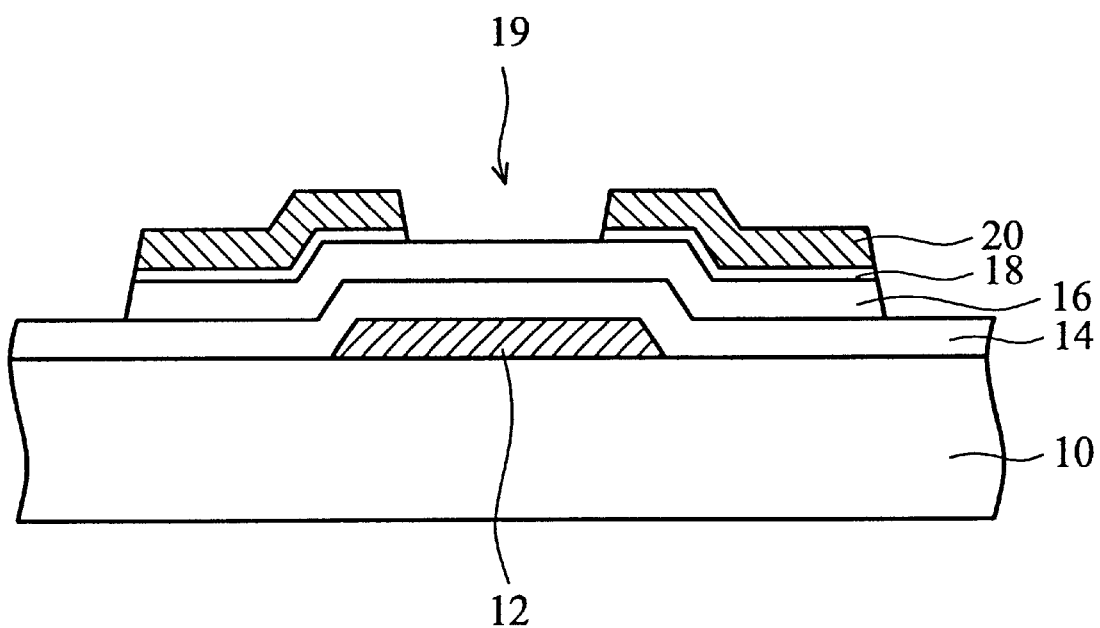
FIG. 1 shows a cross-section of a traditional TFT.
Figure 2A:
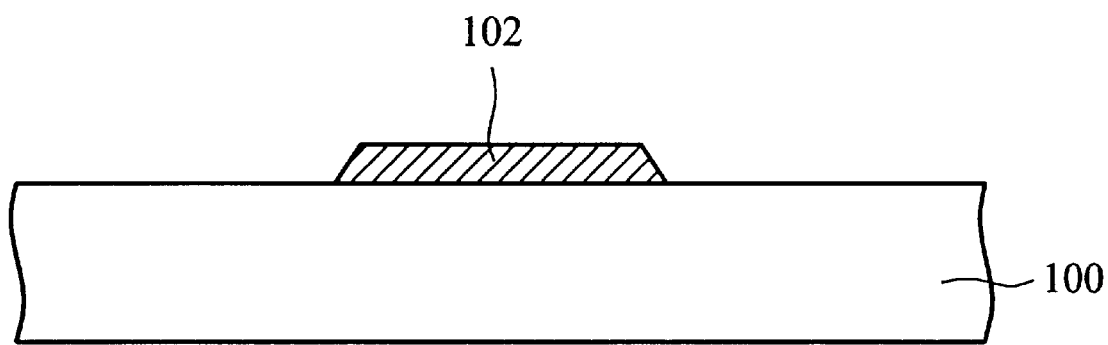
FIGS. 2A~2H show cross-sections of a TFT according to the first embodiment of the present invention.
Figure 2B:
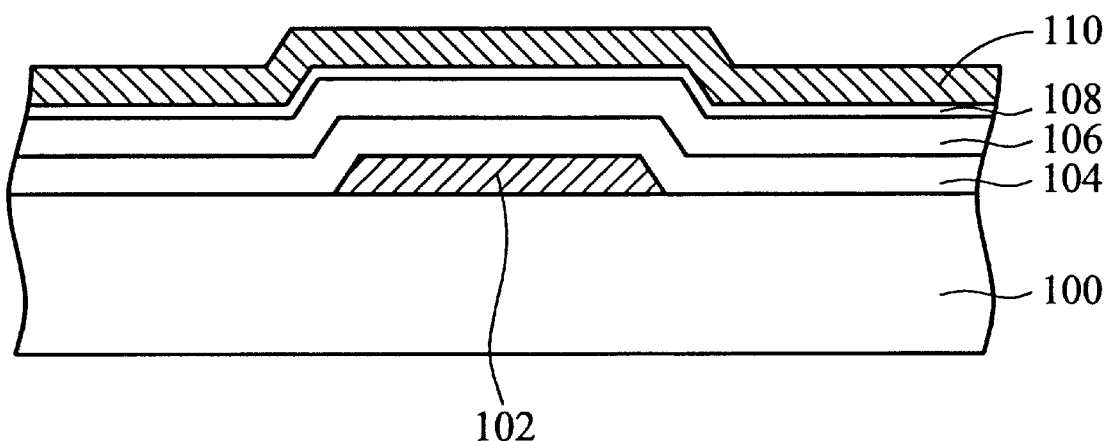

FIGS. 2A~2B depict the formation of a TFT.

In FIG. 2A, a substrate 100, such as glass substrate or quartz, is provided. A first metal layer is formed on the substrate 100, and the then patterned to form a gate electrode 102 and a gate line.

Referring to FIG. 2B, an insulating layer 104, a semiconductor layer 106, a doped silicon layer 108 and a second metal layer 110 are formed on gate electrode 102. The insulating layer 104 is a gate insulating layer, and can be composed of silicon oxide or silicon nitride. The semiconductor layer 106 can be an amorphous silicon layer. The doped silicon layer 108 can be an n-doped amorphous silicon layer.

Figure 2C:
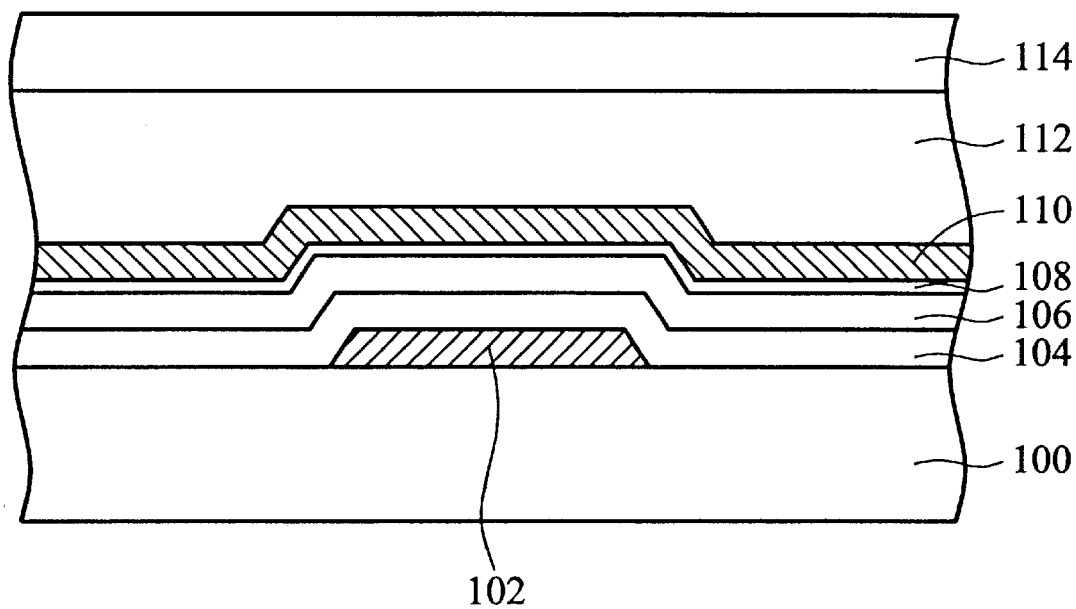

Referring to FIG. 2C, a first photoresist layer with a first absorptivity 112 is formed on the second metal layer 110. A second photoresist layer with a second absorptivity 114 is formed on the first photroresist layer 112. The first absorptivity is lower than the second absorptivity. Preferably, the first absorptivity is 0.2~0.8 times the second absorptivity. Alternatively, the first photoresist layer 112 and the second photoresist layer 114 have different photosensitivities. The photosensitivity of the first photoresist layer 112 is lower than that of the second photoresist layer 114.

Figure 2D:
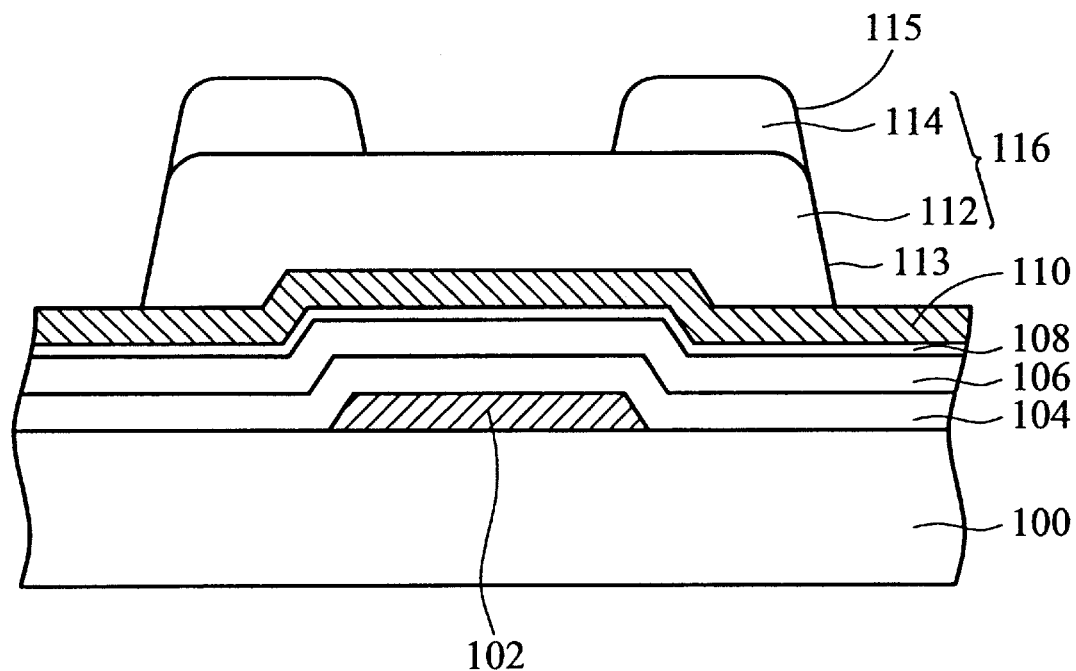

Referring to FIG. 2D, the an exposure and development process is used to form a first pattern 113 in the first photoresist layer 112 and form a second pattern 115 in the second photoresist layer 114 at the same time. The method of patterning the first photoresist layer 112 and the second photoresist layer 114 is selected from a group of multi exposure, halftone mask exposure, and slit mask exposure.

In this embodiment, after the exposure and development process, the thickness of the remaining photoresist is reduced with an increase of energy absorption. In FIG. 3, $PR_1$, $PR_2$ and $PR_3$ indicate photoresists with different absorptivities ranging from high to low. If the first photoresist layer 112 is $PR_1$, the second photoresist layer 114 is $PR_2$, and the exposure energy is E, then the first photoresist layer 112 and the second photoresist layer 114 have different development results. The first photoresist layer 112 or the second photoresist layer 114 can be selectively exposed. If the first photoresist layer 112 is $PR_1$ and the second photoresist layer 114 uses $PR_3$, that is, they have a larger difference in absorptivity, then the second photoresist layer 114 can be fully removed while the first photoresist layer 112 can be maintained.

In the development process, the first photoresist layer 112 and the second photoresist layer 114 can be developed in one step.

After the exposure and development process, the first photoresist layer 112 has the first pattern 113, and the second photoresist layer 114 has the second pattern 115. The first photoresist layer 112 and the second photoresist layer 114 constitute a U-shaped photoresist layer 116, as shown in FIG. 2D.

Figure 2E:
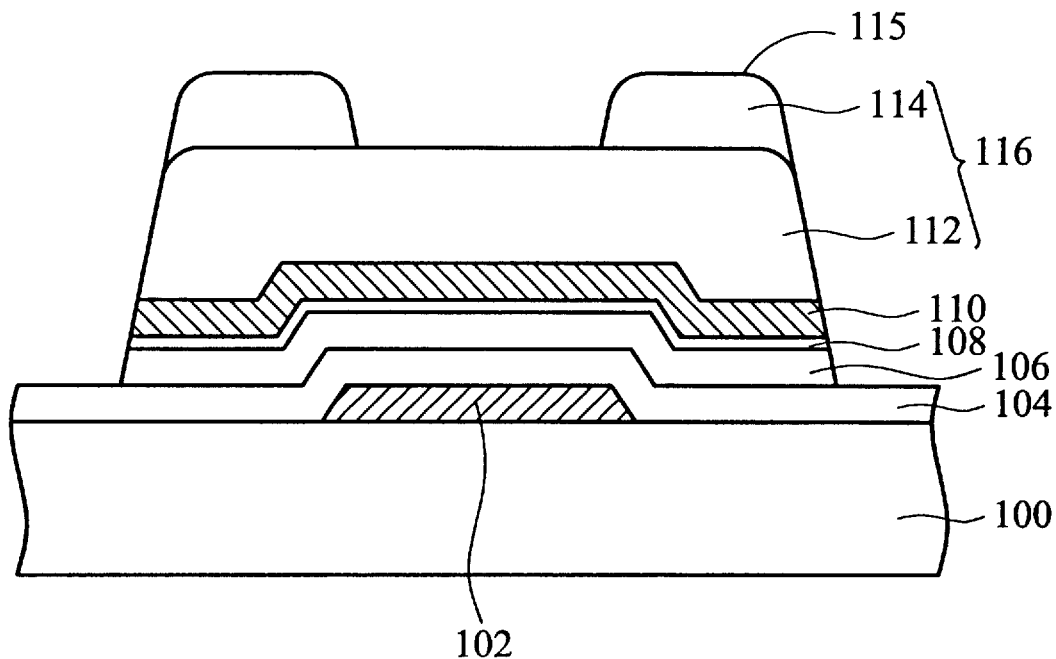
Figure 2F:
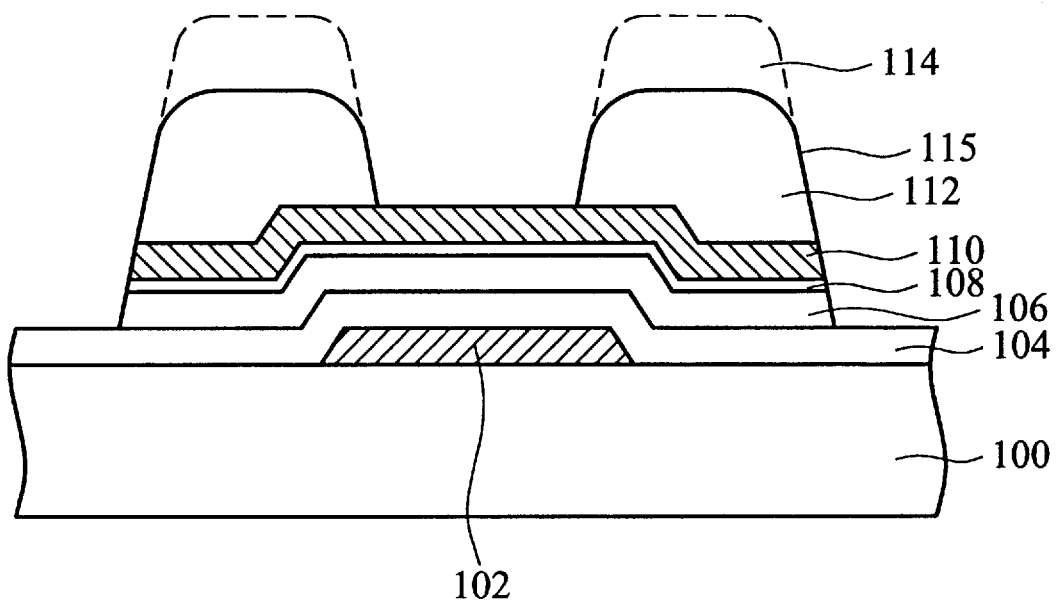

Referring to FIG. 2E, the U-shaped photoresist layer 116 is used as a mask. After an etching process, the semiconductor layer 106, doped silicon layer 108 and second metal layer 110 have the first pattern 113 (see FIG. 2D). Then, the second pattern 115 in the second photoresist layer 114 is transferred to the first photoresist layer 112, as shown in FIG. 2F, by, for example, a dry etching process.

Figure 2G:
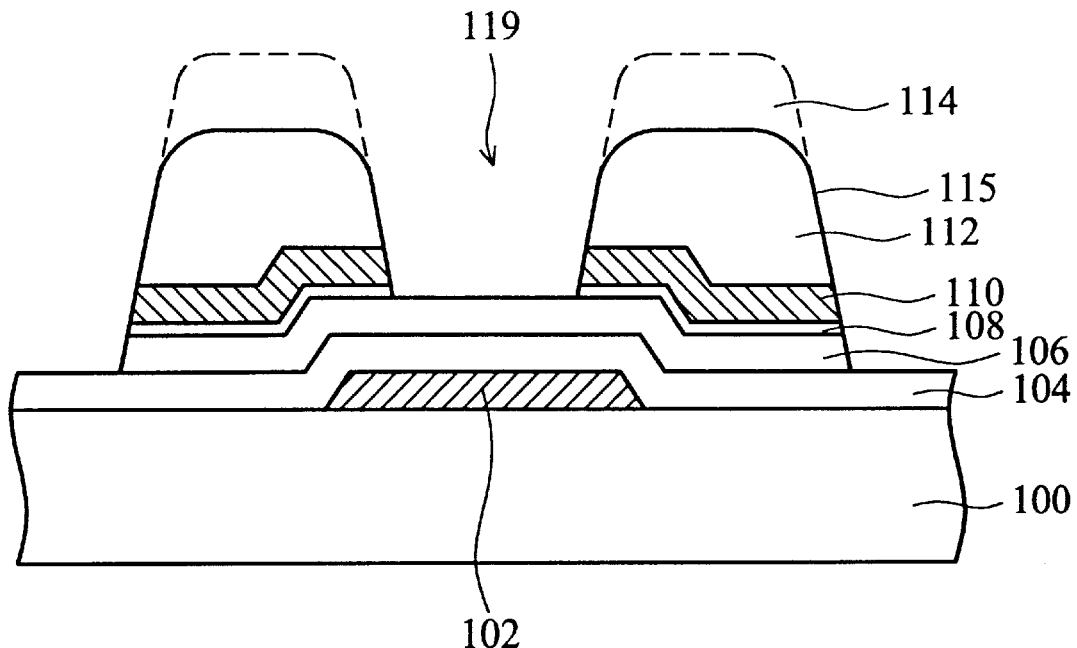

The first photoresist layer 112 with the second pattern 115 is then used as a mask (some of the second photoresist layer 114 may remain thereon). After the etching process, the doped silicon layer 108 and the second metal layer 110 have the second pattern 115 and a channel 119 is formed therein, as shown in FIG. 2G.

Figure 2H:
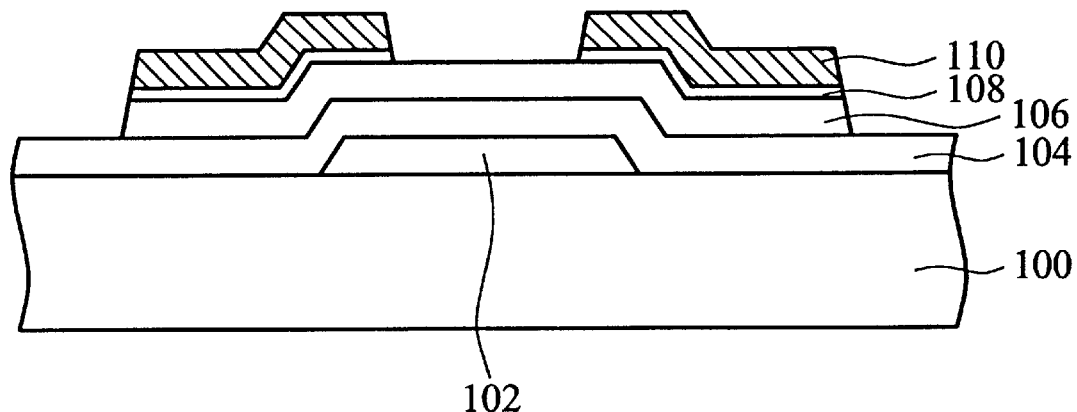

Finally, the first photoresist layer 112 and the second photoresist layer 114 are removed. The TFT is formed as shown in FIG. 2H.

Second Embodiment

Figure 4:
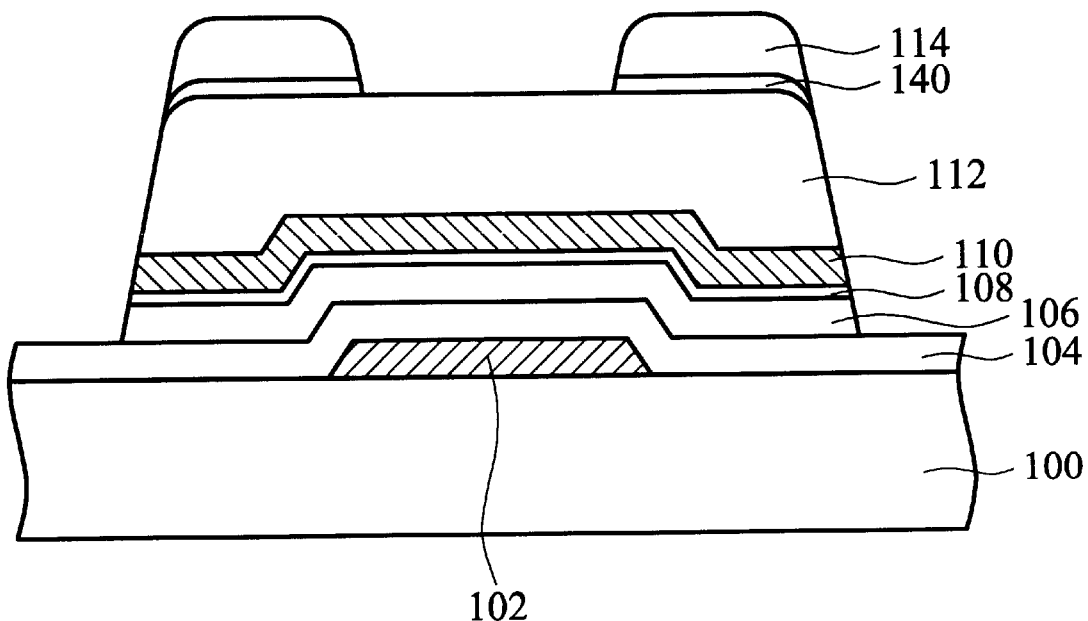
FIG. 4 depicts another fabrication method for TFT according to the second embodiment of the present invention.

In order to enhance the adhesion between the first photoresist layer 112 and the second photoresist layer 114, an adhesion layer 140 is formed between the first photoresist layer 112 and the second photoresist layer 114, as shown in FIG. 4. The adhesion layer 140 can be made of hexamethyldisilazane (HMDS) or other surfactants. The following steps are as FIGS. 2D~2H.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a thin film transistor (TFT), comprising the steps of:
    (a) forming a gate electrode on a substrate;
    (b) forming an insulating layer on the gate electrode;
    (c) forming a semiconductor layer on the insulating layer;
    (d) forming a doped silicon layer on the semiconductor layer;
    (e) forming a metal layer on the doped silicon layer;
    (f) forming a first photoresist layer on the metal layer;
    (g) forming a second photoresist layer on the first photoresist layer;
    (h) performing an exposure process and a development process to form a first pattern on the first photoresist layer and a second pattern on the second photoresist layer at the same time;
    (i) performing an etching process to transfer the first pattern into the semiconductor layer, the doped silicon layer and the metal layer, and transfer the second pattern into the doped silicon layer and the metal layer; and
    (j) removing the first photoresist layer and the second photoresist layer.

2. The method as claimed in claim 1, wherein the first photoresist layer has a first absorptivity, the second photoresist layer has a second absorptivity, and the first absorptivity is lower than the second absorptivity.

3. The method as claimed in claim 2, wherein the first absorptivity is 0.2~0.8 times the second absorptivity.

4. The method as claimed in claim 1, wherein the first photoresist layer has a first photosensitivity, the second photoresist layer has a second photosensitivity, and the first photosensitivity is lower than the second photosensitivity.

5. The method as claimed in claim 1, further comprising a step (f') for forming an adhesion layer between the first photoresist layer and the second photoresist layer.

6. The method as claimed in claim 5, wherein the adhesion layer is made of hexamethyldisilazane (HMDS).

7. The method as claimed in claim 1, wherein the exposure process in the step (h) is selected from a group of a multiple exposure method, a halftone mask exposure method, and a slit mask exposure method.

8. The method as claimed in claim 1, wherein the etching process of the step (i) comprises the steps of:
    (i1) etching the semiconductor layer, the doped silicon layer, and the metal layer by using the first photoresist layer and the second photoresist layer as a mask, so as to transfer the first pattern on the semiconductor layer, the doped silicon layer, and the metal layer;
    (i2) using the second photoresist layer as a mask to transfer the second pattern on the first photoresist layer; and
    (i3) etching the doped silicon layer and the metal layer by using the first photoresist layer with the second pattern as a mask, so as to transfer the second pattern on the doped silicon layer and the metal layer.

9. A method for forming an element, comprising the steps of:
    (a) forming a first photoresist layer on a layer to be etched;
    (b) forming a second photoresist layer on the first photoresist layer;
    (c) performing an exposure process and a development process to form a first pattern on the first photoresist layer and a second pattern on the second photoresist layer at the same time;
    (d) performing an etching process to transfer the first pattern and the second pattern into the layer; and
    (e) removing the first photoresist layer and the second photoresist layer.

10. The method as claimed in claim 9, wherein the first photoresist has a first absorptivity, the second photoresist has a second absorptivity, and the first absorptivity is lower than the second absorptivity.

11. The method as claimed in claim 10, wherein the first absorptivity 0.2~0.8 times the second absorptivity.

12. The method as claimed in claim 9, wherein the first photoresist layer has a first photosensitivity, the second photoresist has a second photosensitivity, and the first photosensitivity is lower than the second photosensitivity.

13. The method as claimed in claim 9, further comprising a step (a') for forming an adhesion layer between the first photoresist layer and the second photoresist layer.

14. The method as claimed in claim 13, wherein the adhesion layer is made of hexamethyldisilazane (HMDS).

15. The method as claimed in claim 9, wherein the exposure process of the step (c) is selected from a group of a multiple exposure method, a halftone mask method, and a slit mask exposure method.

16. The method as claimed in claim 9, wherein the etching process of the step (d) comprises the steps of:
    (d1) etching the layer by using the first photoresist layer and the second photoresist layer as a mask, so as to transfer the first pattern on the layer;
    (d2) using the second photoresist layer as a mask to transfer the second pattern on the first photoresist layer; and
    (d3) etching the layer by using the first photoresist layer with the second pattern as a mask, so as to transfer the second pattern on the layer.

* * * * *